(12) United States Patent
Kornegay et al.

(10) Patent No.: US 7,615,788 B2
(45) Date of Patent: *Nov. 10, 2009

(54) METHOD FOR MONOLITHICALLY INTEGRATING SILICON CARBIDE MICROELECTROMECHANICAL DEVICES WITH ELECTRONIC CIRCUITRY

(75) Inventors: Kevin Kornegay, Ithaca, NY (US); Andrew R. Atwell, Alexandria, VA (US); Mihaela Balseanu, Ithaca, NY (US); Jon Duster, Ithaca, NY (US); Eskinder Hailu, Ithaca, NY (US); Ce Li, Silver Spring, MD (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/699,713

(22) Filed: Jan. 29, 2007

(65) Prior Publication Data

US 2008/0093605 A1   Apr. 24, 2008

Related U.S. Application Data

(62) Division of application No. 10/384,492, filed on Mar. 7, 2003, now Pat. No. 7,170,141.

(60) Provisional application No. 60/362,618, filed on Mar. 8, 2002.

(51) Int. Cl.
*H01L 29/84* (2006.01)

(52) U.S. Cl. .................. 257/77; 257/415; 257/E29.324

(58) Field of Classification Search .................. 257/77, 257/415, E29.234
See application file for complete search history.

(56) References Cited

U.S. PATENT DOCUMENTS

| | | | |
|---|---|---|---|
| 5,165,283 A | 11/1992 | Kurtz et al. | |
| 5,298,767 A | 3/1994 | Shor et al. | |
| 5,303,594 A | 4/1994 | Kurtz et al. | |
| 5,376,241 A | 12/1994 | Shor et al. | |
| 5,386,142 A | 1/1995 | Kurtz et al. | |
| 5,454,915 A | 10/1995 | Shor et al. | |
| 5,461,001 A | 10/1995 | Kurtz et al. | |
| 5,465,249 A | 11/1995 | Cooper, Jr. et al. | |
| 5,549,006 A | 8/1996 | Kurtz | |
| 5,569,932 A | 10/1996 | Shor et al. | |
| 5,604,144 A | 2/1997 | Kurtz | |

(Continued)

OTHER PUBLICATIONS

Ned, A. A., et al., "6H-SiC Pressure Sensor Operation At 600/spl deg/C", Proceedings of the IEEE Fourth International High Temperature Electronics Conference, Albuquerque, NM,(Jun. 14-18, 1998),257-26.*

(Continued)

*Primary Examiner*—Victor A Mandala
(74) *Attorney, Agent, or Firm*—Schwegman, Lundberg & Woessner, P.A.

(57) ABSTRACT

A device and method of forming electronics and microelectromechanical on a silicon carbide substrate having a slow etch rate is performed by forming circuitry on the substrate. A protective layer is formed over the circuitry having a slower etch rate than the etch rate of the silicon carbide substrate. Microelectromechanical structures supported by the substrate are then formed. The circuitry comprises a field effect transistor in one embodiment, and the protective layer comprises a heavy metal layer.

18 Claims, 10 Drawing Sheets

U.S. PATENT DOCUMENTS

| | | | |
|---|---|---|---|
| 5,614,678 A | 3/1997 | Kurtz et al. | |
| 5,622,902 A | 4/1997 | Kurtz et al. | |
| 5,702,619 A | 12/1997 | Kurtz et al. | |
| 5,750,898 A | 5/1998 | Kurtz et al. | |
| 5,955,771 A | 9/1999 | Kurtz et al. | |
| 5,963,788 A | 10/1999 | Barron et al. | |
| 6,034,001 A | 3/2000 | Shor et al. | |
| 6,058,782 A | 5/2000 | Kurtz et al. | |
| 6,171,972 B1 | 1/2001 | Mehregany et al. | |
| 6,229,427 B1 | 5/2001 | Kurtz et al. | |
| 6,235,611 B1 | 5/2001 | Kurtz et al. | |
| 6,272,928 B1 | 8/2001 | Kurtz | |
| 6,272,929 B1 | 8/2001 | Kurtz et al. | |
| 6,293,154 B1 | 9/2001 | Kurtz | |
| 6,306,773 B1 | 10/2001 | Adas et al. | |
| 6,327,911 B1 | 12/2001 | Kurtz et al. | |
| 6,344,663 B1 | 2/2002 | Slater et al. | |
| 6,346,429 B1 | 2/2002 | Aigner et al. | |
| 6,363,792 B1 | 4/2002 | Kurtz et al. | |
| 6,424,017 B2 | 7/2002 | Kurtz et al. | |
| 6,523,415 B2 | 2/2003 | Kurtz et al. | |
| 6,530,282 B1 | 3/2003 | Kurtz et al. | |
| 6,544,674 B2 * | 4/2003 | Tuller et al. | 428/698 |
| 6,564,644 B1 | 5/2003 | Kurtz | |
| 6,577,224 B2 | 6/2003 | Kurtz | |
| 6,588,281 B2 | 7/2003 | Kurtz et al. | |
| 6,595,066 B1 | 7/2003 | Kurtz et al. | |
| 6,601,455 B2 | 8/2003 | Kurtz et al. | |
| 6,612,179 B1 | 9/2003 | Kurtz | |
| 6,689,669 B2 | 2/2004 | Kurtz et al. | |
| 6,690,178 B2 * | 2/2004 | Harris et al. | 324/649 |
| 6,691,581 B2 | 2/2004 | Kurtz et al. | |
| 6,794,271 B2 * | 9/2004 | Harris et al. | 438/456 |
| 6,853,067 B1 * | 2/2005 | Cohn et al. | 257/704 |
| 6,900,108 B2 | 5/2005 | Kurtz et al. | |
| 7,170,141 B2 * | 1/2007 | Kornegay et al. | 257/419 |
| 2003/0141802 A1 * | 7/2003 | Liebeskind et al. | 313/495 |

OTHER PUBLICATIONS

Lam, M. P., "Recent Progress Of Submicron CMOS Using 6H-SIC For Smart Power Applications", *IEEE Transactions on Electron Devices*, 46, No. 3, misc,(Mar. 1993),546-554.

Ned, A. A., et al., "6H-SiC Pressure Sensor Operation At 600/spl deg/C", *Proceedings of the IEEE Fourth International High Temperature Electronics Conference*, Albuquerque, NM,(Jun. 14-18, 1998),257-260.

Ryu, S. , et al., "Monolithic CMOS digital integrated circuits in 6H-SiC using an implanted p-well process", *IEEE Electron Device Letters*, 18(5), (May 1997),194-196.

Sarro, P. M., "Silicon Carbide As A New MEMS Technology", *Sensors and Actuators*, 82, (2000),210-218.

Tanaka, S. , "Deep Reactive Ion Etching Of Silicon Carbide", *J. Vac. Sci. Technol. B*, 19 (6), (Nov. 1, 2001),2173-2176.

\* cited by examiner

METHOD FOR MONOLITHICALLY INTEGRATING SILICON CARBIDE MICROELECTROMECHANICAL DEVICES WITH ELECTRONIC CIRCUITRY

RELATED APPLICATION

This application is a divisional of U.S. patent application Ser. No. 10/384,492, filed Mar. 7, 2003, Issued as U.S. Pat. No. 7,170,141, on Jan. 30, 2007, which claims the benefit of priority under U.S.C. 119(e) to U.S. Provisional Patent Application Ser. No. 60/362,618, filed on Mar. 8, 2002, which is incorporated herein by reference.

GOVERNMENT FUNDING

The invention described herein was made with U.S. Government support under Grant Number ECS-9875206 awarded by National Science Foundation. The United States Government has certain rights in the invention.

FIELD OF THE INVENTION

The present invention relates to forming devices on silicon carbide, and in particular to monolithically integrating microelectromechanical devices with electronic circuitry on silicon carbide.

BACKGROUND OF THE INVENTION

Microelectromechanical devices (MEMS) are currently being formed on silicon substrates with integrated circuitry. However, silicon based circuitry is not well suited to harsh environments. More and more applications or MEMS devices are being considered for harsh environments, and there is a need for a more robust combination of MEMS and circuitry that can withstand high temperatures.

SUMMARY OF THE INVENTION

Microelectromechanical (MEMS) devices with electronic circuitry are formed on a common silicon carbide substrate. MEMS devices are fabricated as part of a silicon carbide electronics process enabling formation of bulk piezoresistive strain sensing regions or surface micromachined electrostatic sensing regions.

In one embodiment, the electronic circuitry process includes temperature compensated metal-oxide semiconductor (MOS) devices for signal conditioning and system control by programmable digital function via non-volatile memory for custom, programmable logic.

Leveraging off of the unique material properties of silicon carbide, a platform for the fabrication of monolithically integrated microelectromechanical devices with electronic circuitry is established. Processing steps enable not only the fabrication of the structural and electronic parts individually, but also the monolithic integration of these parts onto the same substrate.

In one embodiment, electronics are partially fabricated, a protective layer is formed, and then MEMS structures and remaining electronics are formed. There are several options for the MEMS structures including a bulk micromachining process yielding membranes or bossed membranes or cantilevers with or without proof masses and a surface micromachining process with two structural layers for planar structures. The transducer action in this process for converting mechanical motion into electrical signals arise from either piezoresistive strain sensing regions in the bulk process or from electrostatic sensing from the surface micromachined process.

The electronics portion of the process includes MOS structures, compensated for high-temperature operation, that can be used as analog amplifiers or signal control circuitry. In addition, non-volatile memory structures are fabricated to provide digital and logic functions for programmability.

In a further embodiment, one or more silicon carbide microelectromechanical device is integrated with electronic circuitry on a common silicon carbide substrate. The MEMS device is fabricated as part of the silicon carbide electronics process, allowing bulkpiezoresistive strain sensing regions or surface micromachined electrostatic sensing regions to be formed from MEMS elements ranging bulk micromechined to surface micromachined structures. The electronic circuitry process includes temperature compensated MOS circuits for signal conditioning and system control by programmable digital function via non-volatile memory for custom, programmable logic.

DETAILED DESCRIPTION

Figure 1A:
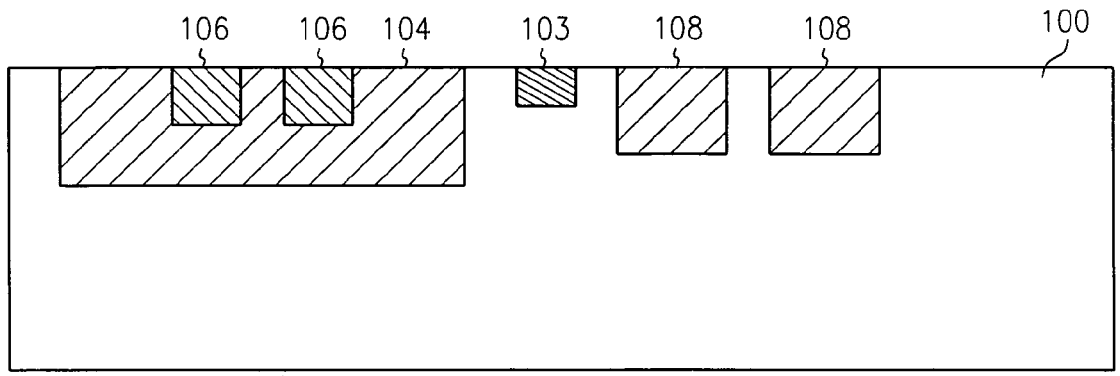
FIGS. 1A, 1B, 1C, 1D, 1E, 1F 1G, 1H, 1I, 1J, 1K, 1L, 1M, and 1N are cross section representations of the formation of electronics and MEMS devices on a silicon carbide substrate.

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Monolithic integration of microelectromechanical devices (MEMS) and electronics on silicon has been successfully implemented over the past several years. However, such devices normally fail in harsh environmental conditions. Devices formed on SiC fare much better in harsh environments, but it has proven difficult to integrate such devices with electronics.

A major challenge in integration of SiC based MEMS with electronics involves processing. Due to SiC's inertness to most wet etch chemistry employed in silicon CMOS processes, plasma based deep reactive ion etching (DRIE) may be employed to form the MEMS structure. This provides a unique challenge during electronic device integration due to the damage that a long DRIE process can cause in electronic devices and circuits. Maintaining a metal oxide semiconductor interface where a metal oxide semiconductor field effect transistor (MOSFET) gate resides is important to the success of creating a usable MOSFET. It must be protected during the process while forming the MEMS structure.

In one embodiment, a protective layer such as electroplated heavy metals is formed over the electronic circuitry. Because of the slow etch rates of SiC, oxide based protective layers may etch too quickly to do the job. The protective layer is on the order of 10s of microns of nickel in one embodiment. The layer thickness is limited to ensure successful use lift off. Other heavy metals can be used. A sacrifical masking material that will survive longer than the etch rate of the SiC bay also be used. In one embodiment, the sacrificial layer has an etch rate on the order or 1 micrometer per minute in a flourinated plasma. SF6, CF4 or a wet etch in a hot bath of ammonia is used for the etch. In a further embodiment, through holes in a desired shape facilitating formation of MEMS devices are cut in the SiC substrate prior to formation of circuitry.

A method is disclosed for integrating one or more silicon carbide microelectromechanical (MEMS) devices with electronic circuitry on a common silicon carbide substrate. The MEMS device is fabricated as part of the silicon carbide electronics process allowing bulk piezoresistive strain sensing regions or surface micromachined electrostatic sensing regions to be formed. In one embodiment, the electronic circuitry process includes temperature compensated MOS for signal conditioning and system control by programmable digital function via non-volatile memory for custom, programmable logic.

Leveraging off of the unique material properties of silicon carbide, a platform for the fabrication of monolithically integrated microelectromechanical devices with electronic circuitry is established. The material properties of silicon carbide presents many fabrication challenges. To address these challenges a unique and novel process sequence has been developed along with unique processing steps to enable not only the fabrication of the structural and electronic parts individually, but also the monolithic integration of these parts onto the same substrate. Methods developed for silicon substrates do not simply transfer to silicon carbide. A different approach in fabrication is required to develop these structures.

In one embodiment, electronics are partially fabricated followed by the MEMS structures and remaining electronics. There are several options for the MEMS structures including a bulk micromachining process yielding membranes or bossed membranes or cantilevers with or without proof masses and a surface micromachining process with two structural layers for planar structures. The transducer action in this process for converting mechanical motion into electrical signals arise from either piezoresistive strain sensing regions in the bulk process or from electrostatic sensing from the surface micromachined process.

The electronics portion of the process includes MOS structures, compensated for high-temperature operation, that can be used as analog amplifiers or signal control circuitry. In addition, non-volatile memory structures are fabricated to provide digital and logic functions for programmability.

In a further embodiment, one or more silicon carbide microelectromechanical devices are integrated with electronic circuitry on a common silicon carbide substrate. The MEMS devices are fabricated as part of the silicon carbide electronics process, allowing bulkpiezoresistive strain sensing regions or surface micromachined electrostatic sensing regions to be formed from MEMS clements ranging bulk micromachined to surface micromachined structures. The electronic circuitry process includes temperature compensated MOS for signal conditioning and system control by programmable digital function via non-volatile memory for custom, programmable logic.

A detailed fabrication flow for monolithic integration of SiC MEMS with SiC electronic devices and circuits process follows. Using this process functional electronic devices and circuits may be formed that operate at approximately 280° C. as well as MEMS structures. The process allows for the MEMS structure to be fabricated at the beginning, intermediate, or at the very end of the process flow. If the MEMS component is fabricated prior to any electronic device processing, care must be taken to ensure that the MEMS structures are not damaged during the ion implant activation thermal cycle (1600° C. for 30 minutes). Ideally, the MEMS structure will be fabricated immediately following all ion implantations and high temperature activation steps. Further, the MEMS structure can also be fabricated after all of the electronic devices are processed. In this case, a thick protective passivation dielectric is deposited on top of the electronics. Since long duration DRIE steps are used to form the MEMS structures, circuit layout may require considerable attention and thought prior to fabrication. For example, a layout is arranged such that that finished devices and circuits are protected from the high energy plasma by the ~15 microns thick nickel DRIE mask.

Further electronic devices which may be formed include P-N and Schottky diodes, MOS and MIM capacitors, N and P-enhancement MOSFETs, N-type normally on depletion NMOSFETs, and signal conditioning amplifier circuitry to process data taken from the MEMS structure. These devices and circuits may be functional up to approximately 280° C. or higher. Further MEMS structures include bulk micro-machined circular diaphragm pressure/acceleration sensor with piezoresistors used for strain sensing.

The following is an example of process flow for fabricating the silicon carbide electronics and MEMS structures as shown in FIGS. 1A through 1U.

FIG. 1A shows a single-crystal silicon carbide substrate 100 that is used to start the process. In one embodiment, an approximately 3 micrometer epitaxial layer of SiC is formed on the wafer to provide a base substrate prior to circuit formation. The epitaxial layer can be doped to a desired concentration. In further embodiments, ion implantation is used to dope the substrate to a desired concentration.

The substrate 100 surfaces are conditioned by solvent clean and acid clean. In one embodiment, at least one surface 100 is so conditioned. A registration mark 103 is etched into the substrate for alignments between different mask steps. Multiple such marks may be used. The surface 100 is patterned for formation of P wells 104. P-type dopants are introduced via ion implantation or selective epitaxy to define the P wells. The substrate surface is then patterned again for forming N wells. N-type dopants are introduced via ion implantation or selective epitaxy to define N Wells 106. Surface 100 is then patterned for introduction of P-type dopants via ion implantation or selective epitaxy to define P+ Regions 108 for a PFET device. Surface 100 is then patterned for introduction of N-type dopants via ion implantation or selective epitaxy to define N+ Regions at 106 for a NFET device.

Figure 1B:
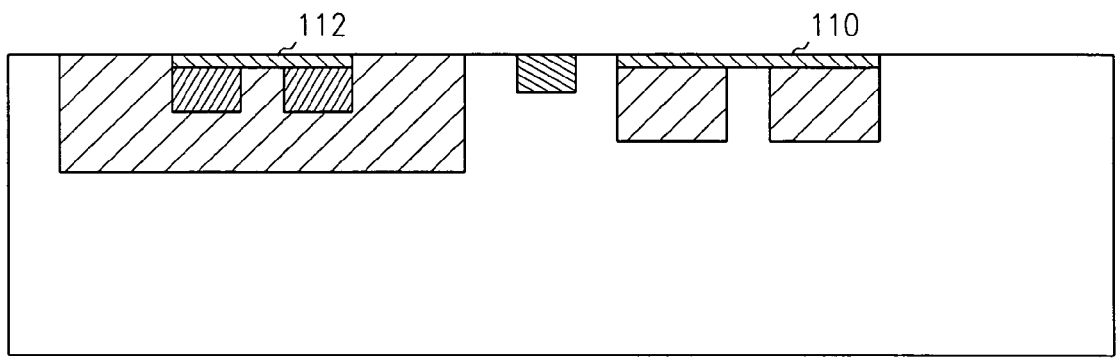
Figure 1C:
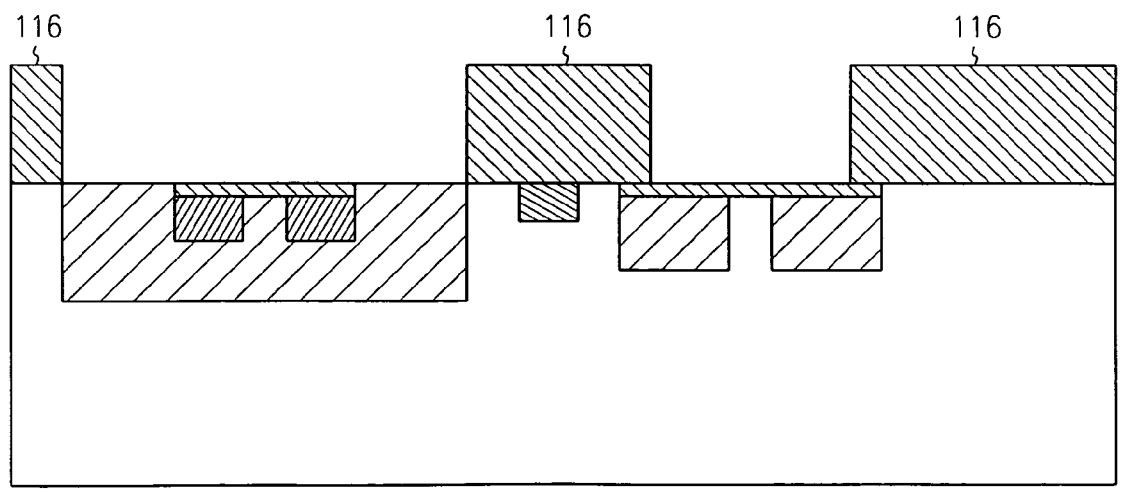
Figure 1D:
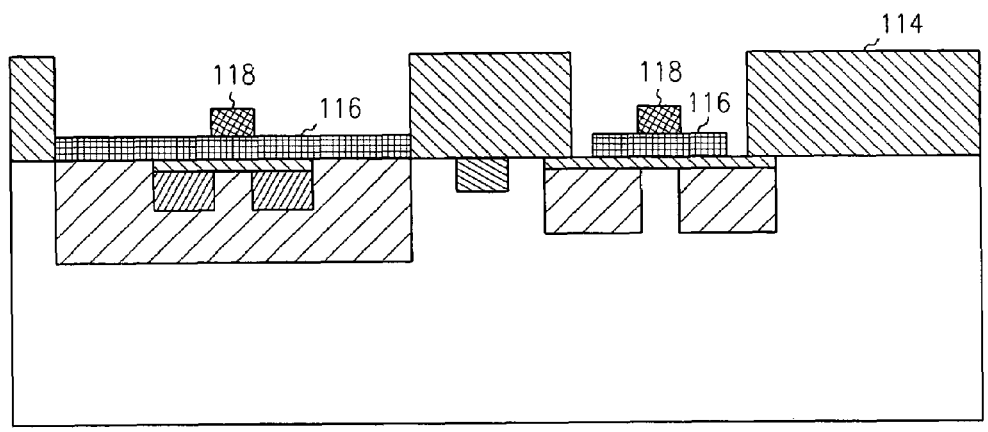

A threshold adjustment implant for MOSFETS is then performed as indicated at 110 and 112. The threshold adjustment implant allows for the lowering of the threshold voltages of enhancement MOSFETs as well as the realization of normally on depletion mode MOSFETs. Then, a field dielectric layer 114 is deposited, which is then patterned to define active areas as indicated in FIG. 1B. A layer of gate dielectric 116 is thermally grown or deposited and patterned as seen in FIG. 1C. A polysilicon layer, doped or undoped, or other gate electrode material, is deposited at 118. A gate electrode layer is patterned to form Gate1 at 118 in FIG. 1D.

Figure 1E:
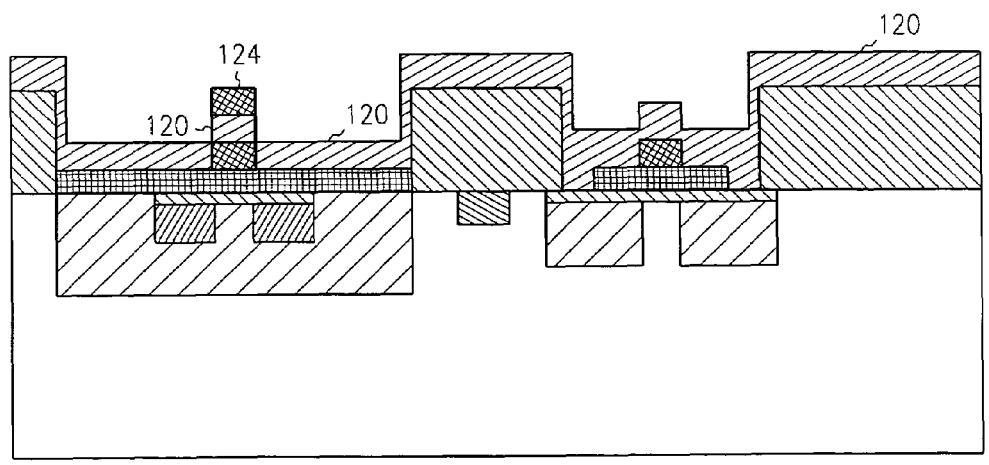

In FIG. 1E, a layer of dielectric 120 is thermally grown or deposited. A polysilicon layer, doped or undoped, or other gate electrode material, is deposited. Gate electrode layer is patterned to form Gate2 at 124.

Figure 1F:
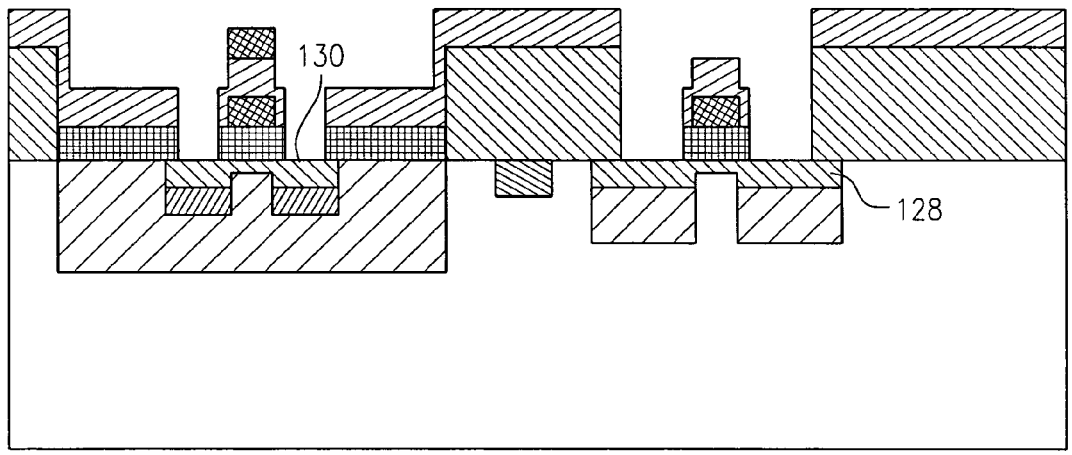

As seen in FIG. 1F, P+ and/or N+ ohmic contact formation is then performed following different options. In a first option, a same metal 128, 130 is deposited for P+ and N+ contacts respectively, followed by one annealing step. In an alternative, the same metal is actually a combination of metals suitable for forming contacts. In a second option, metal is deposited for P+ and N+ contacts in separate steps, followed by one annealing step. In a third option, metal is deposited and an anneal is performed for P+ and N+ contacts in separate steps all as represented at 128 and 130 respectively.

Figure 1G:
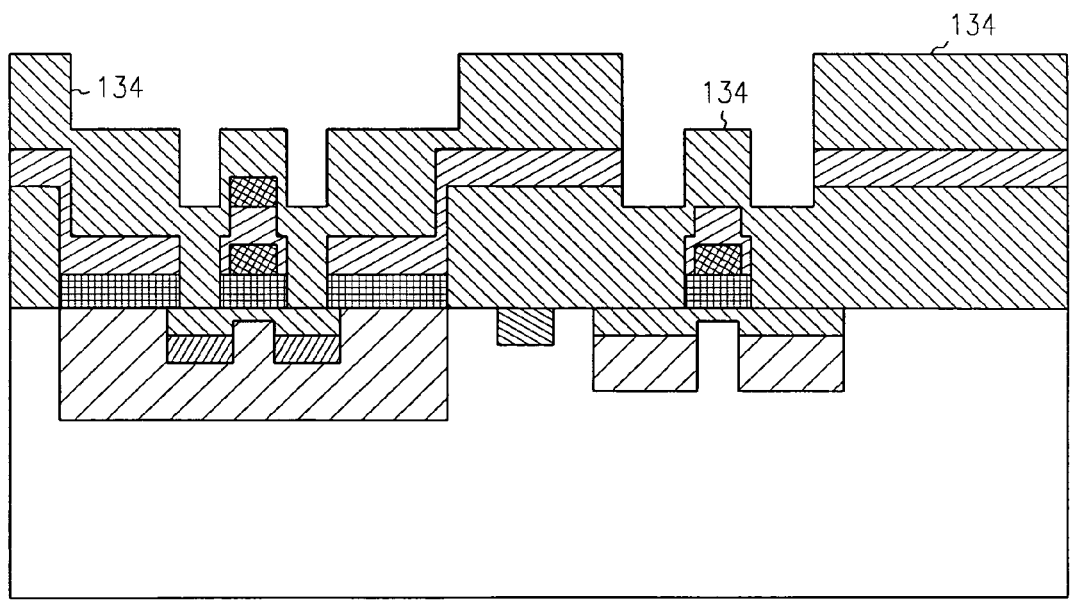
Figure 1H:
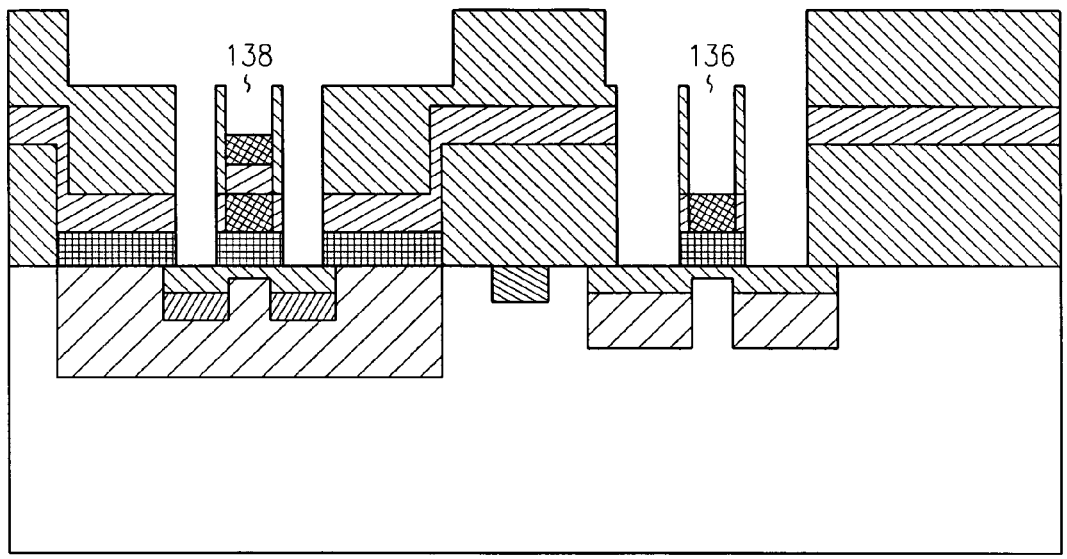
Figure 1I:
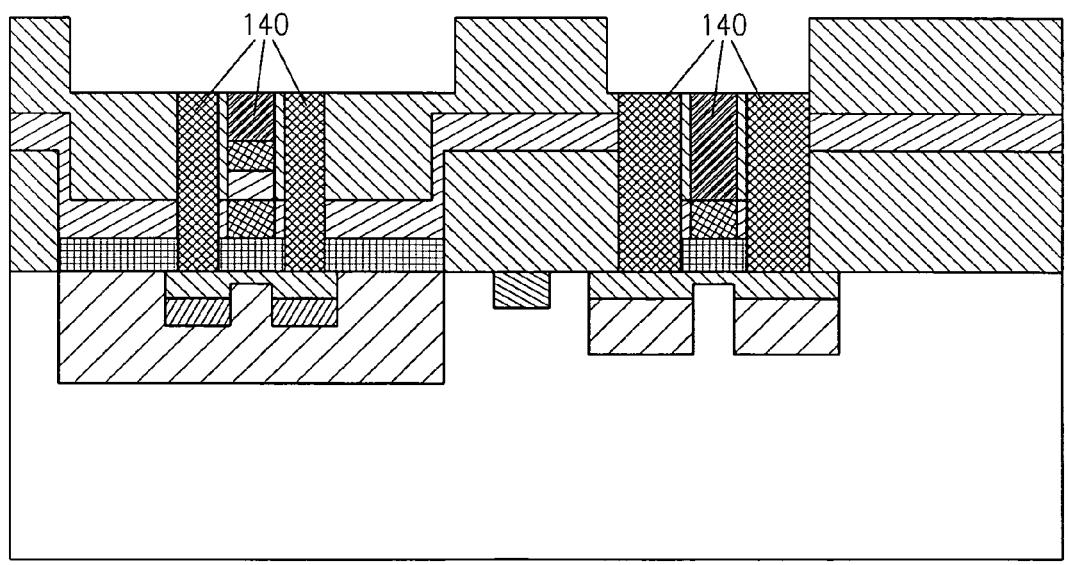
Figure 1J:
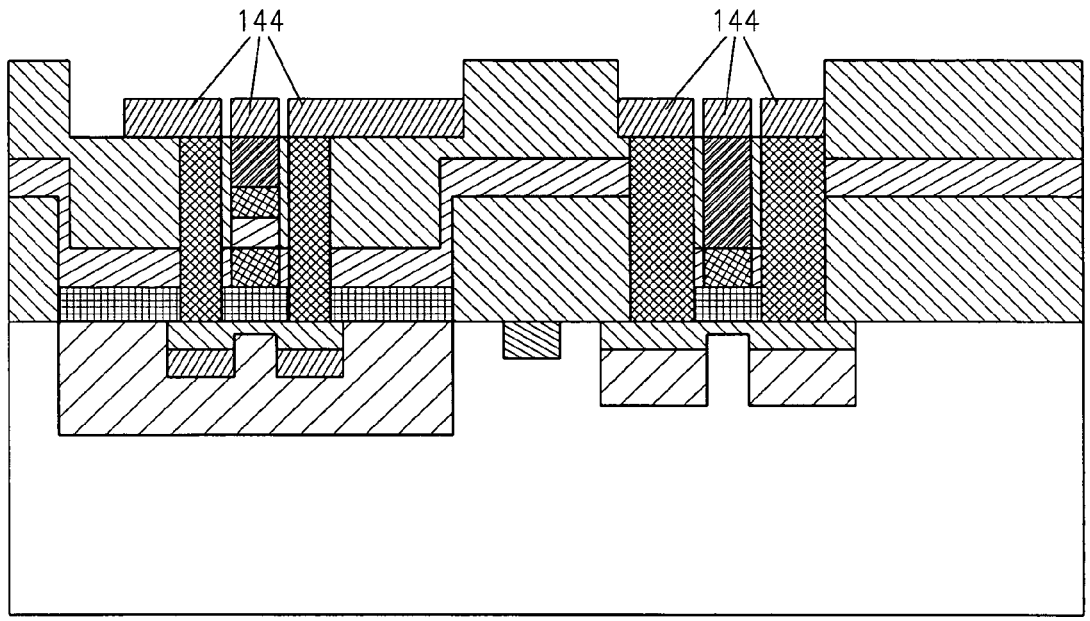
Figure 1K:
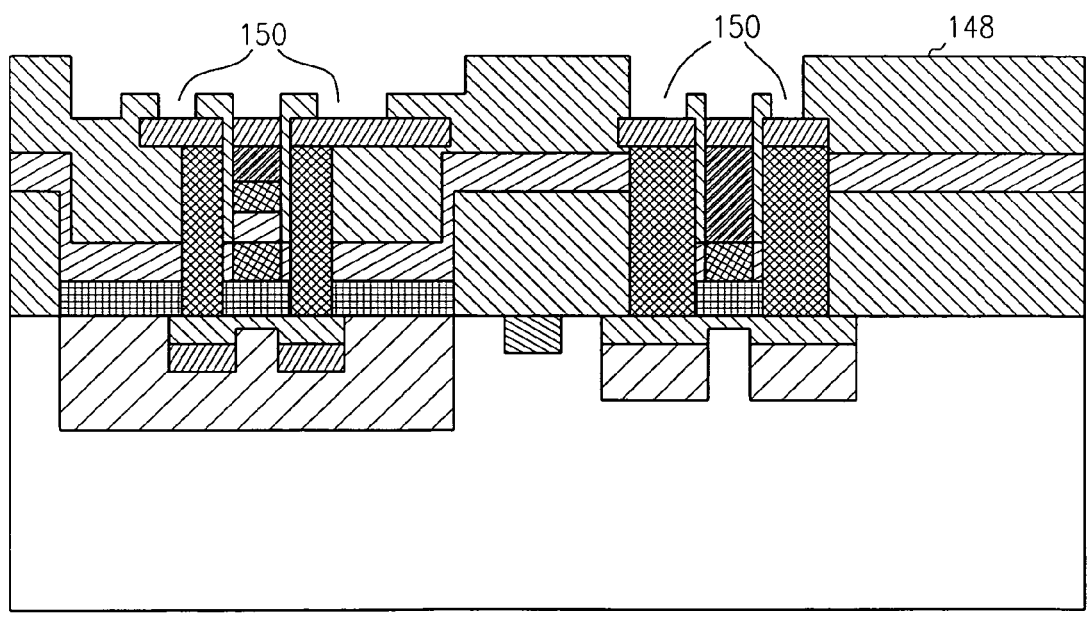
Figure 1L:
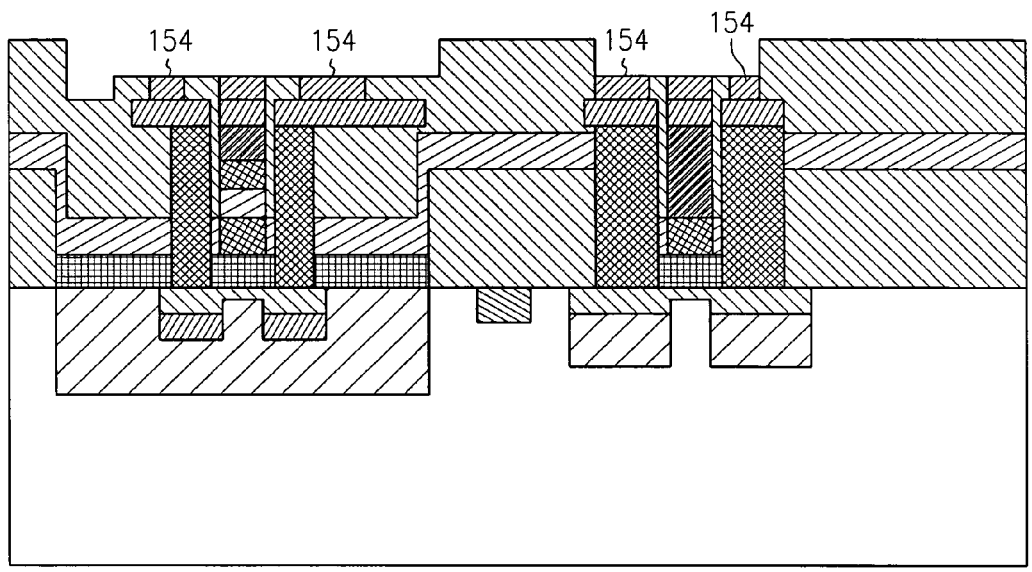
Figure 1M:
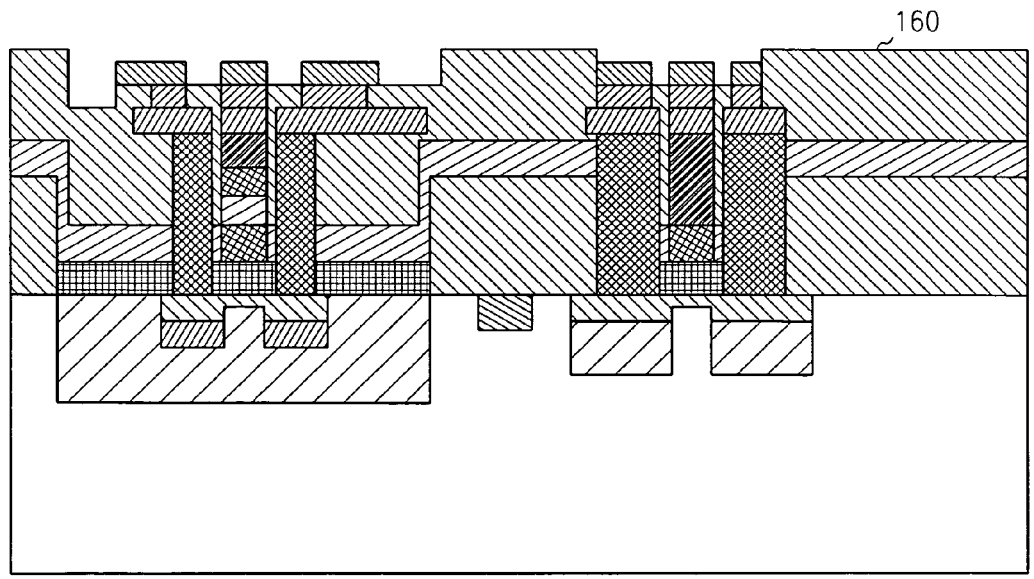
Figure 1N:
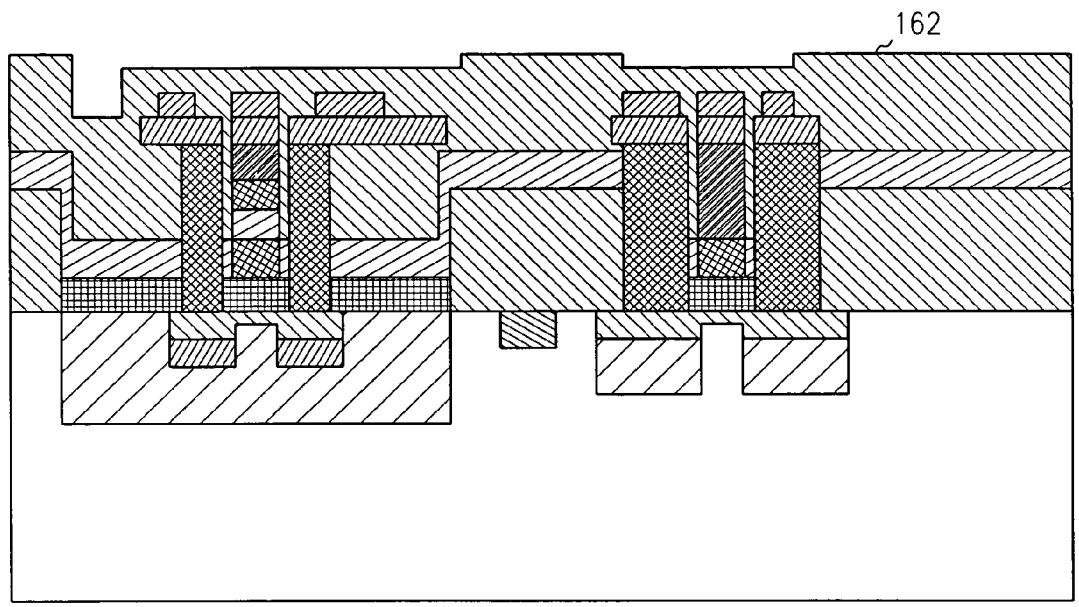

A layer of dielectric 134 is deposited as seen in FIG. 1G. Vias to Poly Silicon gates are shown in FIG. 1H. Dielectric layer 134 is then patterned and etched to define source/drain vias, Gate1 via 136 and Gate2 via at 138 as seen in FIG. 1H. The vias are filled with metal 140 as seen in FIG. 1I. A metal1 layer 144 is deposited, patterned and etched as seen in FIG. 1J. A layer of dielectric 148 is then deposited. The dielectric layer is patterned and etched to define Inter-Metallic Vias 150 as seen in FIG. 1K. The Inter-Metallic Vias are filled with metal 154 as seen in FIG. 1L. A Metal2 layer 160 is then deposited, patterned and etched as seen in FIG. 1M. This layer serves as a further interconnect level. A layer of dielectric 162 is then deposited as seen in FIG. 1N. Dielectric 162 is thick, and serves as a protection layer to inhibit degradation of the electronic devices formed beneath it in response to etching of MEMS structures.

Figure 2:
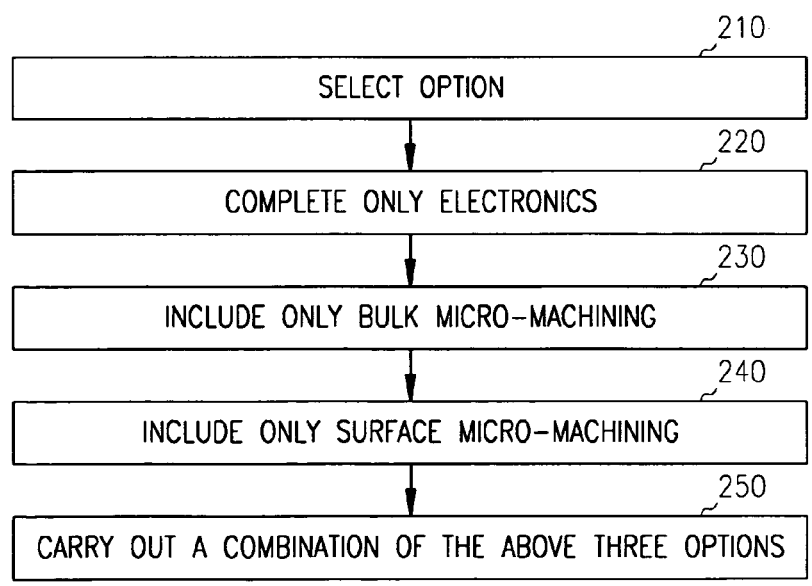
FIG. 2 is a block diagram of options for forming different structures.

As seen in FIG. 2, there are several options available following the dielectric deposition. Box 210 illustrates the ability to select and option. A first option, Option A 220 is followed if only electronics formation is needed. An Option B 230 is followed if surface-micromachined MEMS structures with electronics are to be included. Option C 240 is followed if bulk-micromachined MEMS structures with electronics are to be included. A further option 250 utilizes two or more of the options, such as use of Option B then Option C if both bulk- and surface-micromachined structures are desired.

Figure 3:
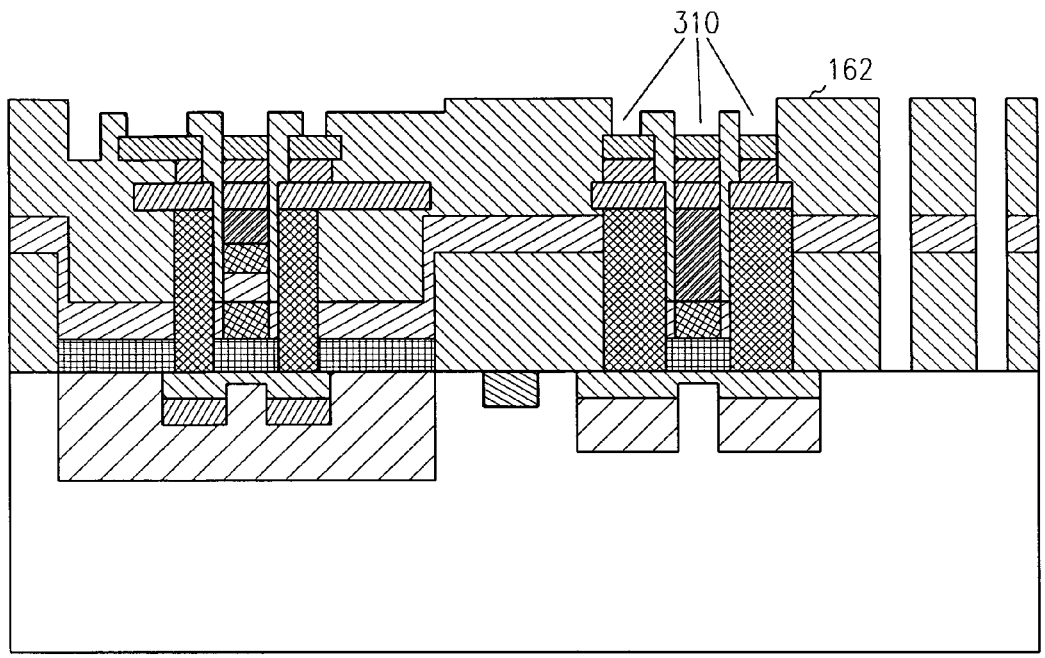
FIG. 3 is a cross section showing the formation of electronics following formation of a protective layer.

Option A is shown in the cross sections of FIG. 3. Option A is utilized for the formation of electronics only. Dielectric is patterned and etched to define Pad Cuts 310. Deeper cuts to the substrate may also be made, making it possible to contact the substrate directly. This can be useful for example in forming Schottky Barrier diodes etc.

Figure 4:
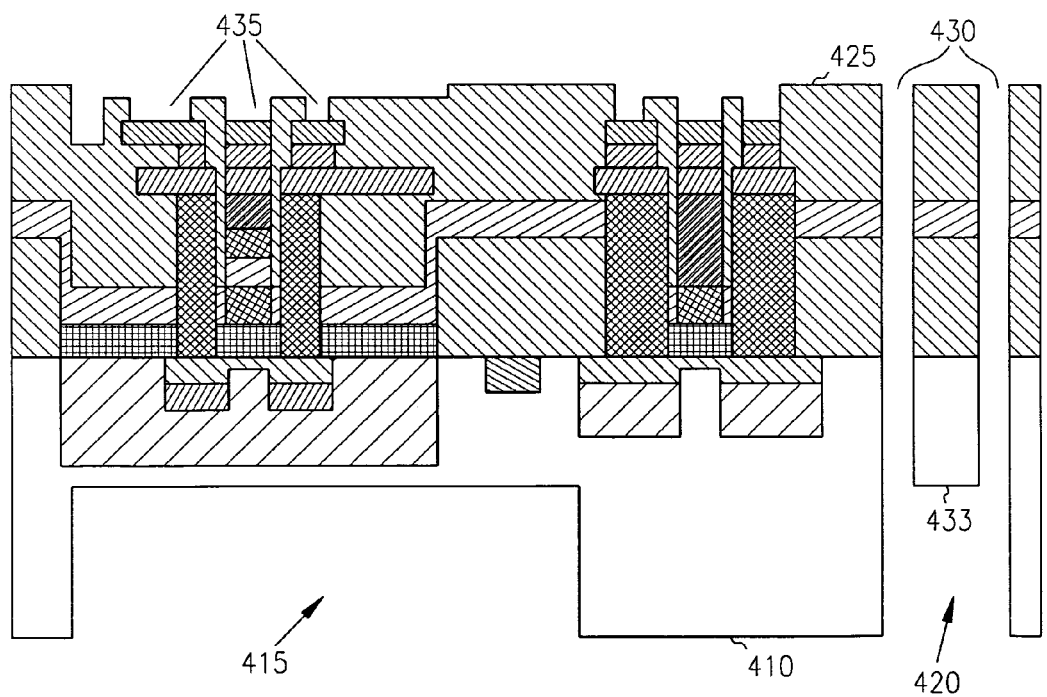
FIG. 4 is a cross section showing bulk micromachining following formation of a protective layer.

Option B is shown in the cross section of FIG. 4 showing Bulk Micromachining. A second, or backside mask is used to pattern a backside 410 of the substrate. A backside etch is then performed to form openings 415 and 420. A first side 425 of the substrate is then patterned using a topside mask. A topside etch is then performed to provide through holes 430 opening to backside 410 through opening 420. A released structure 433 is formed by such etches. In one embodiment, various released structures include cantilever, beams with mass, or bossed structures. Dielectric is patterned and etched to define Pad Cuts 435. Vestiges of metal layer 160 remain after such etching.

It should be noted that the dimensions illustrated in the figures are not to scale and some features are shown much larger with reference to others to enhance visibility of them. In one embodiment, the substrate is approximately 100 to 300 micrometers thick, while the layers formed on top of the substrate are approximately 3 to 5 microns thick. P wells 104 are approximately 1 micron thick, and opening 415 extends to approximately 50 micrometers of the top of the substrate. These dimensions are for example only, and may be modified significantly without departing from the invention.

Figure 5A:
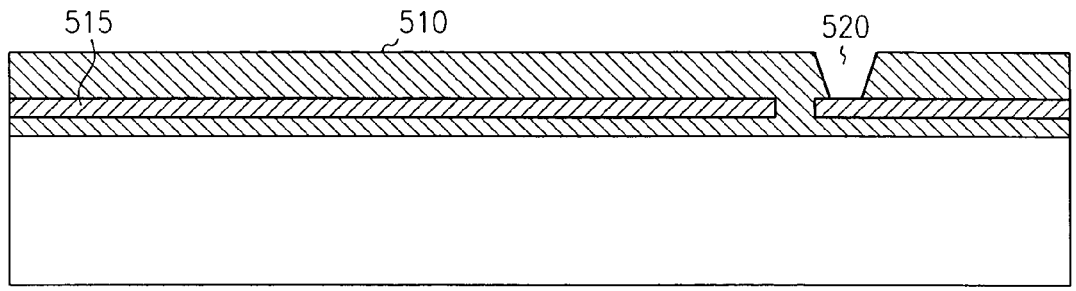
FIGS. 5A, 5B, 5C, 5D and 5E are cross sections showing surface micromachining following formation of a protective layer.
Figure 5B:
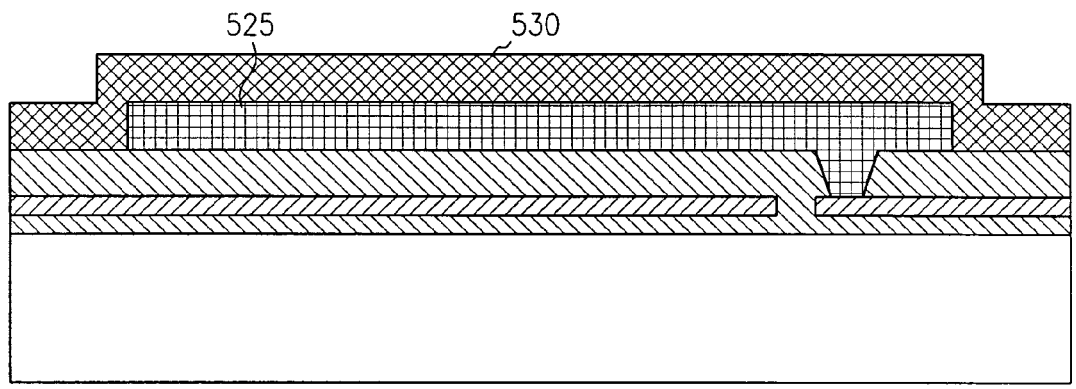
Figure 5C:
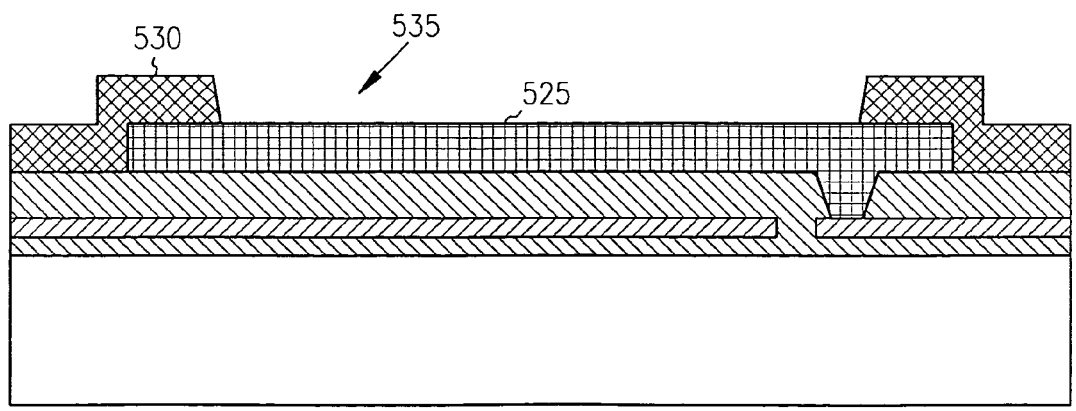
Figure 5D:
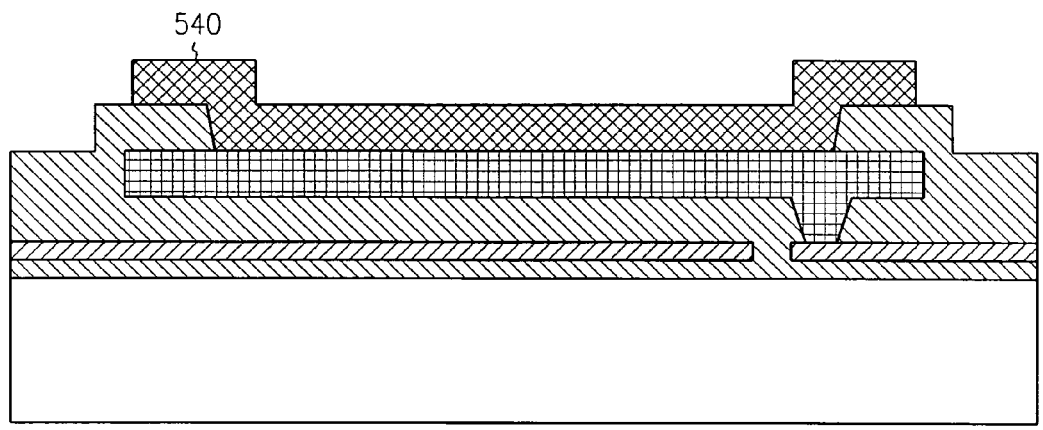
Figure 5E:
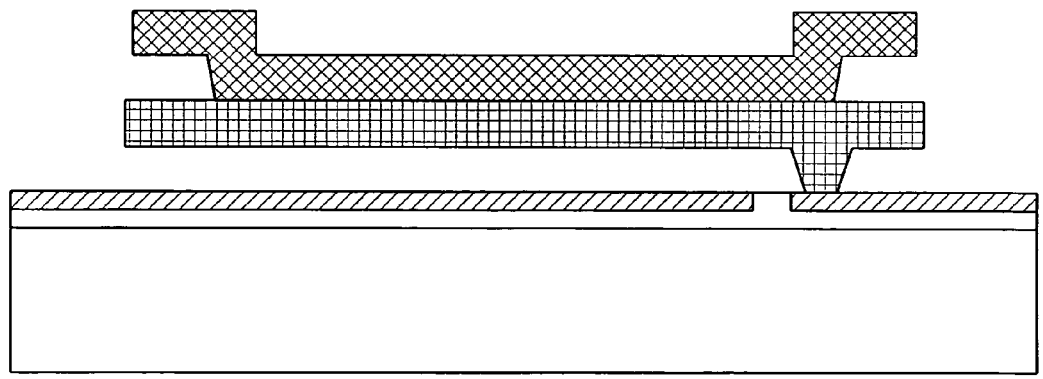

Option C for Surface Micromachining is shown in FIGS. 5A-5E. A top passivation and sacrificial dielectric layer 510 are deposited on top of a patterned metal ground plane 515 as seen in FIG. 5A. The metal layer is formed on top of an insulator dielectric such as $SiO_2$. A via 520 or multiple vias are formed as by etching to the metal ground plane 515 following patterning. A first structural layer 525 is deposited and patterned, followed by a deposition of a second sacrificial oxide 530 as seen in FIG. 5B. A via or vias 535 to the first structural layer 525 is formed after patterning in FIG. 5C. A second structural layer 540 is deposited and patterned in FIG. 5D. Pad Cuts are defined and the sacrificial layer 510 is etched to simultaneously release structures 525 and 540.

One example of a devices constructable using this fabrication process is intelligent microsystems for high acceleration, high-g load, and high temperature applications.

In one fabrication example, the process is started with a 1' diameter, Cree, Inc. research grade n-type 6H—SiC (3.5° off from 0001 direction) wafer is utilized. The wafer contains an ~5 micron thick n-type ($n_d$=2.9×10$^{15}$ cm$^{-3}$) epitaxial layer. A non-self aligned process is adopted for the electronics fabrication in one embodiment. Ion implantations at 600° C. (P-well, N+, and P+ implants) and room temperature (threshold adjustment implant) are used to form the P-well, N+, and P+ regions as well as to adjust the threshold voltage of the normally-on depletion mode NMOSFETs. The dose and energy of the implant species used in one embodiment follow. Many other dose and energy levels may be utilized due to the protection provided by the protection layer. Such doses and energy levels may be varied to obtain different desired device characteristics.

P+ (Aluminum): $2.2 \times 10^{14}$ cm$^{-2}$@40 keV, $3.4 \times 10^{14}$ cm$^{-2}$@80 keV, $4 \times 10^{14}$ cm$^{-2}$@130 keV, and $1 \times 10^{15}$ cm$^{-2}$@210 keV.

N+ (Nitrogen): $4 \times 10^{15}$ cm$^{-2}$@30 keV, $6 \times 10^{15}$ cm$^{-2}$@65 keV, $8 \times 10^{15}$ cm$^{-2}$@115 keV, and $1.4 \times 10^{16}$ cm$^{-2}$@190 keV.

P-Well (Boron): $3.75 \times 10^{12}$ cm$^{-2}$@15 keV, $6.3 \times 10^{12}$ cm$^{-2}$@35 keV, $9.3 \times 10^{12}$ cm$^{-2}$@70 keV, $1.44 \times 10^{13}$ cm$^{-2}$@125 keV, $2.69 \times 10^{13}$ cm$^{-2}$@230 keV, and $6 \times 10^{13}$ cm$^{-2}$@360 keV.

N-Threshold Adjusting Implant (Nitrogen): $1 \times 10^{12}$ cm$^{-2}$@23 keV, $1.5 \times 10^{12}$ cm$^{-2}$@58 keV, $2 \times 10^{12}$ cm$^{-2}$@110 keV, and $3.8 \times 10^{12}$ cm$^{-2}$@190 keV.

After ion implantation and a subsequent RCA clean, a thin (~200 Å) layer of silicon dioxide is thermally grown and stripped off via HF dip. A blanket "implant activation" is done at 1600° C. for 30 minutes in argon ambient. Following a second RCA clean, a combination of grown (at 1150° C. for 2 hours) and deposited (at 800° C.) gate oxidation is used to form a gate dielectric with total thickness of 750 Å. P+ doped poly silicon is used to form the gate electrode. Aluminum and titanium are used to form ohmic contacts to the P+ and N+ regions respectively, and platinum is used as the interconnect metal for both metal levels.

The invention claimed is:

1. A device formed on a silicon carbide substrate, the device comprising:
   silicon carbide based monolithic integrated signal conditioning or system control circuitry supported by the substrate; and
   a silicon carbide containing microelectromechanical structure supported by the silicon carbide substrate.

2. The device of claim 1 wherein the integrated circuitry comprises temperature compensated MOS devices.

3. The device of claim 1 wherein the integrated circuitry comprises programmable logic.

4. The device of claim 1 wherein the integrated circuitry and microelectromechanical structure are formed on opposite sides of the silicon carbide substrate.

5. A device comprising:
a silicon carbide substrate;
silicon carbide based integrated signal conditioning or system control circuitry formed on the silicon carbide substrate; and
a silicon carbide microelectromechanical structure monolithically integrated with the silicon carbide based integrated circuitry on the silicon carbide substrate.

6. The device of claim 5 wherein the integrated circuitry comprises MOSFET circuitry.

7. The device of claim 5 wherein the integrated circuitry comprises MOS devices.

8. A device comprising:
a silicon carbide substrate:
silicon carbide based monolithic integrated programmable logic formed on the silicon carbide substrate: and
a silicon carbide microelectromechanical structure monolithically integrated with the silicon carbide based integrated circuitry on the silicon carbide substrate.

9. A device comprising:
a silicon carbide substrate;
integrated circuitry formed on the silicon carbide substrate; and
a silicon carbide microelectromechanical structure monolithically integrated with the integrated circuitry on the silicon carbide substrate, wherein the integrated circuitry comprises multiple devices selected from the group consisting of temperature compensated MOS for signal processing and system control, custom programmable logic, Schottky diodes, MOS and NIM capacitors, N and P-enhancement MOSFETs, N-type normally on depletion NMOSFETs.

10. The device of claim 9 wherein the microelectromechanical structure is selected from the group consisting of bulk piezoresistive strain sensing regions, diaphragms, surface micromachined electrostatic sensing regions, membranes, and cantilevers.

11. A device comprising:
a silicon carbide substrate;
a plurality of integrated circuit logic devices electrically coupled to form logic functions formed in the silicon carbide substrate; and
a portion of the substrate including at least one silicon carbide based microelectromechanical structure.

12. A device comprising:
a silicon carbide substrate;
a plurality of integrated circuit logic devices formed in the silicon carbide substrate; and
at least one silicon carbide based microelectromechanical structure supported by the silicon carbide substrate and coupled to the integrated circuit logic devices.

13. The device of claim 12 wherein the silicon carbide substrate comprises single crystal silicon carbide.

14. The device of claim 12 wherein the silicon carbide substrate comprises amorphous silicon carbide.

15. A device comprising:
a silicon carbide substrate;
a plurality of integrated circuit temperature compensated devices formed in the silicon carbide substrate; and
at least one silicon carbide based microelectromechanical structure supported by the silicon carbide substrate and coupled to the integrated circuit logic devices.

16. The device of claim 15 wherein the integrated circuit temperature compensated devices are adapted to perform at least one of signal conditioning and system control.

17. The device of claim 15 wherein the integrated circuit temperature compensated devices comprise metal-oxide semiconductor programmable logic.

18. A device formed on a silicon carbide substrate, the device comprising:
silicon carbide based integrated signal conditioning or system control circuitry formed on the silicon carbide substrate; and
a monolithically integrated silicon carbide microelectromechanical structure supported by the silicon carbide substrate and functionally coupled to the silicon carbide based integrated circuitry.

* * * * *